(12) United States Patent
Watanabe et al.

(10) Patent No.: US 9,024,330 B2
(45) Date of Patent: May 5, 2015

(54) SEMICONDUCTOR DEVICE AND MANUFACTURING METHOD THEREOF

(71) Applicants: Yukihiko Watanabe, Nagoya (JP); Sachiko Aoi, Nagoya (JP); Masahiro Sugimoto, Toyota (JP); Akitaka Soeno, Toyota (JP); Shinichiro Miyahara, Nagoya (JP)

(72) Inventors: Yukihiko Watanabe, Nagoya (JP); Sachiko Aoi, Nagoya (JP); Masahiro Sugimoto, Toyota (JP); Akitaka Soeno, Toyota (JP); Shinichiro Miyahara, Nagoya (JP)

(73) Assignees: Toyota Jidosha Kabushiki Kaisha, Toyota (JP); Denso Corporation, Kariya (JP)

( * ) Notice: Subject to any disclaimer, the term of this patent is extended or adjusted under 35 U.S.C. 154(b) by 0 days.

(21) Appl. No.: 14/141,174

(22) Filed: Dec. 26, 2013

(65) Prior Publication Data

US 2014/0231827 A1 Aug. 21, 2014

(30) Foreign Application Priority Data

Feb. 15, 2013 (JP) .................................. 2013-027352

(51) Int. Cl.
| | | |
|---|---|---|
| H01L 29/47 | (2006.01) | |
| H01L 29/45 | (2006.01) | |
| H01L 29/16 | (2006.01) | |
| H01L 21/285 | (2006.01) | |
| H01L 29/78 | (2006.01) | |
| H01L 21/04 | (2006.01) | |

(52) U.S. Cl.
CPC .......... *H01L 29/47* (2013.01); *H01L 21/28518* (2013.01); *H01L 29/1608* (2013.01); *H01L 29/45* (2013.01); *H01L 29/78* (2013.01); *H01L 21/0485* (2013.01)

(58) Field of Classification Search
USPC .............. 257/77, 330, 335, E21.066, E21.41, 257/289, 359
See application file for complete search history.

(56) References Cited

U.S. PATENT DOCUMENTS

| | | | |
|---|---|---|---|
| 5,614,749 A | 3/1997 | Ueno | |
| 2003/0022474 A1* | 1/2003 | Grover et al. | ................. 438/570 |
| 2004/0212011 A1 | 10/2004 | Ryu | |
| 2009/0272982 A1 | 11/2009 | Nakamura et al. | |
| 2013/0043524 A1 | 2/2013 | Yamagami et al. | |

FOREIGN PATENT DOCUMENTS

| | | |
|---|---|---|
| JP | A-8-204179 | 8/1996 |
| JP | A-2004-522319 | 7/2004 |
| JP | A-2005-108926 | 4/2005 |
| JP | A-2006-524432 | 10/2006 |
| JP | A-2009-302510 | 12/2009 |
| JP | A-2010-225615 | 10/2010 |
| JP | A-2012-049562 | 3/2012 |
| WO | 2011/136272 A1 | 11/2011 |

* cited by examiner

*Primary Examiner* — Cathy N Lam
(74) *Attorney, Agent, or Firm* — Oliff PLC

(57) ABSTRACT

A method of manufacturing a semiconductor device includes forming an ohmic electrode in a first area on one of main surfaces of a silicon carbide layer, siliciding the ohmic electrode, and forming a Schottky electrode in a second area on the one of the main surfaces of the silicon carbide layer with self alignment. The second area is exposed where the ohmic electrode is not formed.

4 Claims, 6 Drawing Sheets

SEMICONDUCTOR DEVICE AND MANUFACTURING METHOD THEREOF

CROSS-REFERENCE TO RELATED APPLICATION

This application claims priority to Japanese Patent Application No. 2013-027352 filed on Feb. 15, 2013, the contents of which are hereby incorporated by reference into the present application.

TECHNICAL FIELD

The present application relates to a semiconductor device of which semiconductor material is silicon carbide, and a manufacturing method thereof.

DESCRIPTION OF RELATED ART

Silicon carbide is known as a semiconductor material allowing implementation of a semiconductor device with a low loss and which can operate stably at high temperature. For semiconductor devices using silicon carbide as the semiconductor material, a structure has been proposed in which a field effect transistor includes a built-in Schottky barrier diode in order to reduce the number of components of the semiconductor device. An example of such a structure is disclosed in Japanese Patent Application Publication No. H8-204179.

BRIEF SUMMARY OF INVENTION

To manufacture the semiconductor device proposed in Japanese Patent Application Publication No. H8-204179, a trench penetrating a p-type base region needs to be formed. This increases the number of masks needed to manufacture the semiconductor device, thus increasing manufacturing costs. A semiconductor device has been desired which is formed using silicon carbide as a semiconductor material and includes a built-in Schottky barrier diode and which can be manufactured by simplified manufacturing steps.

A method of manufacturing a semiconductor device disclosed herein includes forming an ohmic electrode in a first area on one of main surfaces of a silicon carbide layer, siliciding the ohmic electrode, and forming a Schottky electrode in a second area on the one of the main surfaces of the silicon carbide layer with self alignment. The second area is exposed where the ohmic electrode is not formed.

According to this manufacturing method, the ohmic electrode is preformed to allow the Schottky electrode to be formed by self alignment. Thus, the manufacturing method allows the manufacture, by simplified manufacturing steps, of the semiconductor device formed using silicon carbide as a semiconductor material and including a built-in Schottky barrier diode.

A semiconductor device disclosed herein includes a silicon carbide layer, an ohmic electrode being in an ohmic contact with a first area on one of main surfaces of the silicon carbide layer, and a Schottky electrode being in an ohmic contact with a second area on the one of the main surfaces of the silicon carbide layer and covering the ohmic electrode. The silicon carbide layer includes a drift region of a first conductivity type, a base region of a second conductivity type, and a source region of the first conductivity type. The drift region includes an exposure portion exposed in the second area on the one of the main surfaces of the silicon carbide layer. The base region is disposed above the drift region, exposed in the first area on the one of the main surfaces of the silicon carbide layer, and includes portions that are spaced apart by the exposure region in between. The source region is surrounded by the base region and exposed in the first area on the one of the main surfaces of the silicon carbide layer.

In the semiconductor device, the exposure portion of the drift region is exposed in the second area on the one of the main surfaces of the silicon carbide layer. The Schottky electrode is in Schottky contact with the exposure portion of the drift region. Moreover, in the semiconductor device, the base region and the source region are exposed in the first area on the one of the main surfaces of the silicon carbide layer. The ohmic electrode is in ohmic contact with the base region and the source region. In this case, the Schottky electrode covers the ohmic electrode. That is, the Schottky electrode has a structure that can be produced by self alignment using the ohmic electrode. The semiconductor device has a structure that can be manufactured by simplified manufacturing steps.

DETAILED DESCRIPTION OF INVENTION

Figure 1:
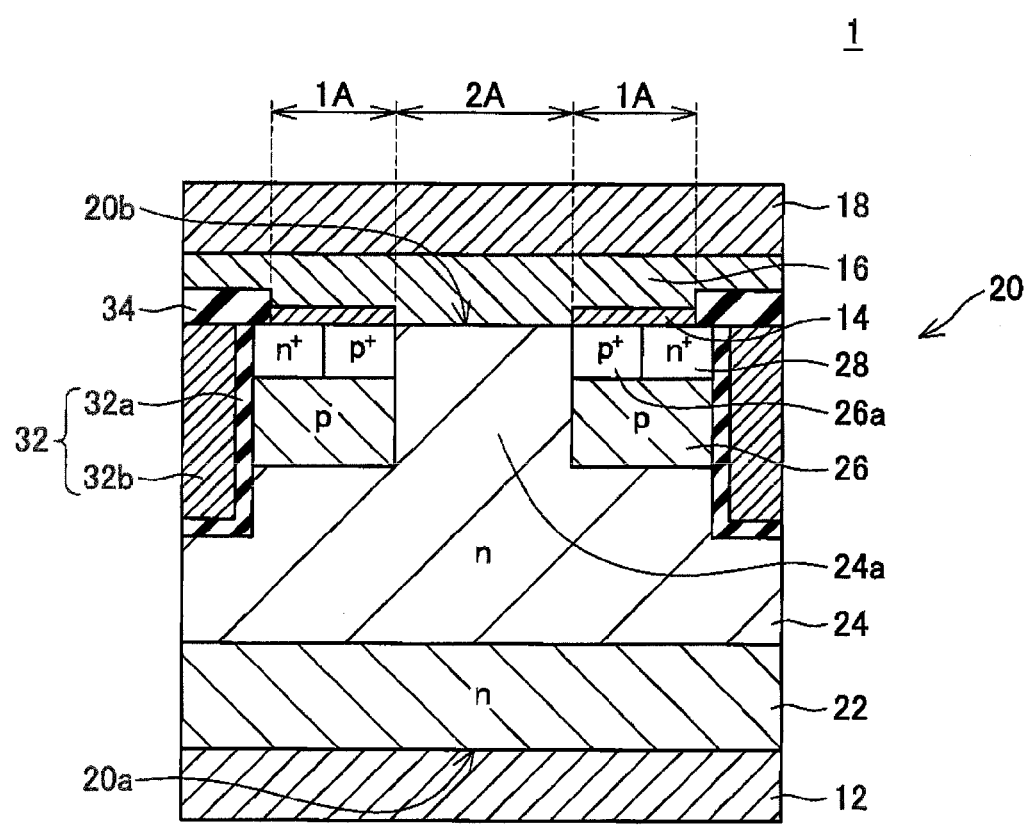
FIG. 1 schematically shows a cross-sectional view of a main part of a semiconductor device.

A manufacturing method disclosed herein is used to manufacture a semiconductor device formed using silicon carbide as a semiconductor material and including a built-in Schottky barrier diode. Here, the semiconductor device may be, for example, a metal oxide semiconductor field effect transistor (MOSFET) or an insulated gate bipolar transistor (IGBT). The manufacturing method includes forming an ohmic electrode in a first area on one of main surfaces of a silicon carbide layer, siliciding the ohmic electrode, and forming a Schottky electrode in a second area on the one of the main surfaces of the silicon carbide layer with self alignment, wherein the second area is exposed where the ohmic electrode is not formed. In this case, a material for the ohmic electrode may be, for example, nickel, titanium, or aluminum. A material for the Schottky electrode may be, for example, molybdenum, nickel, gold, titanium, or aluminum.

An embodiment of a semiconductor device disclosed herein includes a silicon carbide layer, an ohmic electrode being in an ohmic contact with a first area on one of main surfaces of the silicon carbide layer, and a Schottky electrode being in an ohmic contact with a second area on the one of the main surfaces of the silicon carbide layer and covering the ohmic electrode. The silicon carbide layer includes a drift region of a first conductivity type, a base region of a second conductivity type, and a source region of the first conductivity type. The drift region includes an exposure portion exposed in the second area on the one of the main surfaces of the silicon carbide layer. The base region is disposed above the drift region, exposed in the first area on the one of the main surfaces of the silicon carbide layer, and includes portions that are spaced apart by the exposure region in between. The source region is surrounded by the base region and exposed in the first area on the one of the main surfaces of the silicon carbide layer. The semiconductor device has a built-in Schottky barrier diode formed by the Schottky contact between the exposure portion of the drift region and the Schottky electrode.

The semiconductor device may further include a gate portion facing the base region separating the drift region and the source region. The semiconductor device has a structure in which a field effect transistor includes a built-in Schottky barrier diode.

The gate portion may include a trench gate electrode filled within a trench penetrating the base region from the one of the main surfaces of the silicon carbide layer. The semiconductor device has a field effect transistor with a trench type insulating gate portion.

When the gate portion includes the trench gate electrode, the semiconductor device may further include a barrier layer of an insulating material, the barrier layer covering the trench gate electrode. In this case, the Schottky electrode may cover the barrier layer.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as manufacturing methods for the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Example

As shown in FIG. 1, a semiconductor device 1 includes a drain electrode 12, a silicon carbide layer 20, an ohmic electrode 14, a Schottky electrode 16, a source electrode 18, an insulating gate portion 32, and a barrier layer 34.

The drain electrode 12 is formed to cover an entire back surface 20a of the silicon carbide layer 20 and is in ohmic contact with the back surface 20a of the silicon carbide layer 20. A material for the drain electrode 12 may be, for example, nickel, titanium, gold, or a layered electrode thereof.

The silicon carbide layer 20 has an n-type substrate 22, an n-type drift region 24, a p-type base region 26, and an n-type source region 28. The n-type substrate 22 is a silicon carbide substrate with a [0001] plane orientation. The drift region 24 is formed by crystal growth from the substrate 22 utilizing an epitaxial growth technique. The drift region 24 has a protruding exposure portion 24a in an upper portion of the drift region 24. An upper surface of the exposure portion 24a is exposed in a second area 2A on a surface 20b of the silicon carbide layer 20.

The base region 26 is formed by introducing p-type impurities (by way of example, aluminum) through the surface 20b of the silicon carbide layer 20 by performing an ion implantation operation a plurality of times with an ion range changed for each operation. Opposite portions of the base region 26 are arranged with the exposure portion 24a of the drift region 24 located between the portions. In other words, the exposure portion 24a of the drift region 24 is formed between the opposite portions of the base region 26. The base region 26 has a contact portion 26a in an upper portion thereof. The contact portion 26a is exposed in a part of a first area 1A on the surface 20b of the silicon carbide layer 20 and contains a relatively high concentration of impurities.

The source region 28 is formed by introducing n-type impurities (by way of example, phosphor) through the surface 20b of the silicon carbide layer 20 utilizing the ion implantation technique. The source region 28 is surrounded by the base region 26 and spaced apart from the drift region 24 by the base region 26. The source region 28 is exposed in a part of the first area 1A on the surface 20b of the silicon carbide layer 20. By way of example, when the surface 20b of the silicon carbide layer 20 is observed, the exposure portion 24a of the drift region 24, the contact portion 26a of the base region 26, and the source region 28 appear to have a striped layout.

The ohmic electrode 14 is formed on a part of the surface 20b of the silicon carbide layer 20 by patterning and is in ohmic contact with the contact portion 26a of the base region 26 and the source region 28 both exposed in the first area 1A on the surface 20b of the silicon carbide layer 20. A material for the ohmic electrode 14 maybe, for example, silicided nickel.

The Schottky electrode 16 is formed to cover the entire surface side 20b of the silicon carbide layer 20 and covers a part of the surface 20b of the silicon carbide layer 20, the ohmic electrode 14, and a barrier layer 34. The Schottky electrode 16 is in Schottky contact with the exposure portion 24a of the drift region 24 exposed in the second area 2A on the surface 20b of the silicon carbide layer 20. Molybdenum is used as a material for the Schottky electrode 16.

The source electrode 18 covers the entire surface of the Schottky electrode 16. A material for the source electrode 18 may be, for example, titanium, aluminum, or a layered electrode thereof.

The insulating gate portion 32 faces the base region 26 separating the drift region 24 and the source region 28, and forms a channel in the base region 26 between the drift region 24 and the source region 28. The insulating gate portion 32 includes a gate insulating film 32a and a trench gate electrode 32b both provided in a trench penetrating the base region 26 from the surface of the silicon carbide layer 20. The gate insulating film 32a is formed by being coated on an inner wall of the trench utilizing a thermal oxidation technique or a CVD technique. The trench gate electrode 32b is formed by being filled into the trench coated with the gate insulating film 32a utilizing the CVD technique. The barrier layer 34 covers and insulates the trench gate electrode 32b from the ohmic electrode 14, the Schottky electrode 16, and the source electrode 18.

The semiconductor device 1 is, for example, used for an inverter device that supplies an alternating current to an AC motor. The semiconductor device 1 has a structure in which a metal oxide semiconductor field effect transistor (MOSFET) with the trench type insulating gate portion 32 includes a built-in Schottky barrier diode. The Schottky barrier diode is built into the MOSFET by bringing the Schottky electrode 16 into Schottky contact with the exposure portion 24a of the drift region 24. The Schottky barrier diode operates as a freewheel diode. That is, the Schottky barrier diode serves to pass a current to the AC motor while the MOSFET is off.

Figure 2:
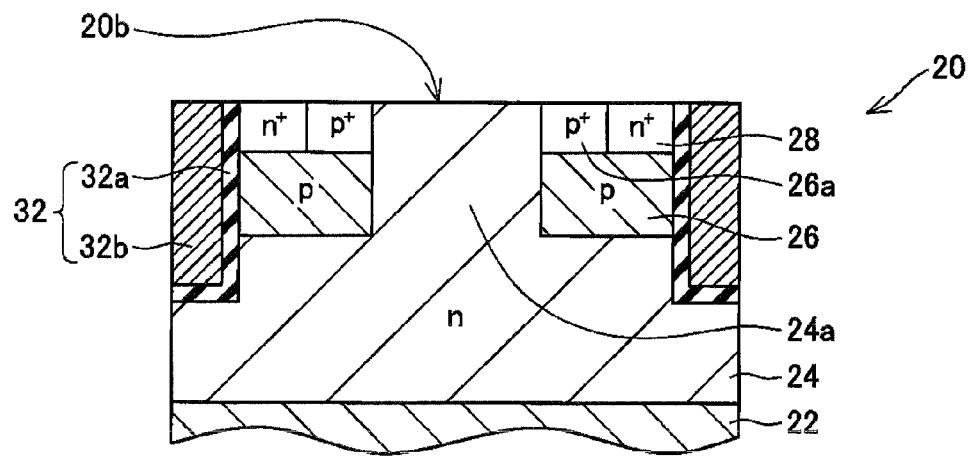
FIG. 2 schematically shows a cross-sectional view of a characteristic part of the semiconductor device during a step of manufacturing the semiconductor device.

Now, a method of manufacturing the semiconductor device 1 will be described. First, as shown in FIG. 2, the drift region 24, the base region 26, and the source region 28 are formed on the substrate 22 utilizing the epitaxial growth technique and the ion implantation technique. Then, the gate insulating film 32a and trench gate electrode 32b of the insulating gate portion 32 are formed utilizing an etching technique or the CVD technique. For the above-described portion of the manufacturing method, a known manufacturing method may be applied.

Figure 3:
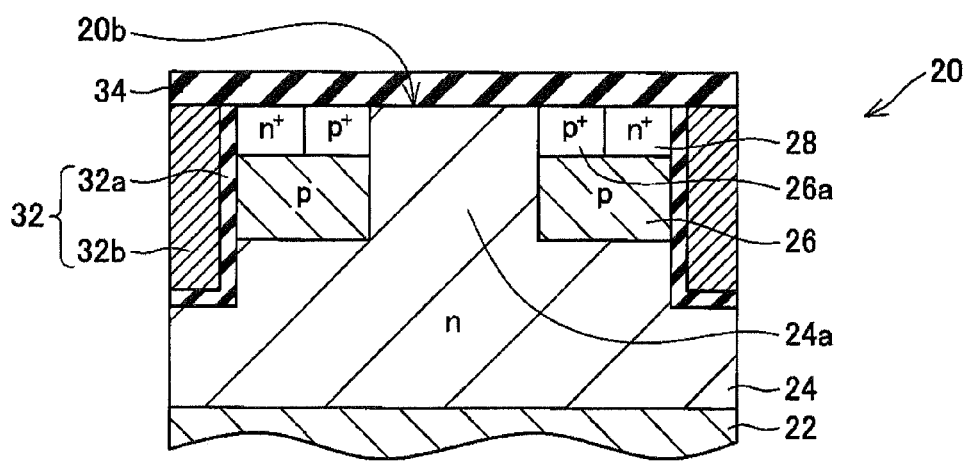
FIG. 3 schematically shows a cross-sectional view of the characteristic part of the semiconductor device during a step of manufacturing the semiconductor device.
Figure 4:
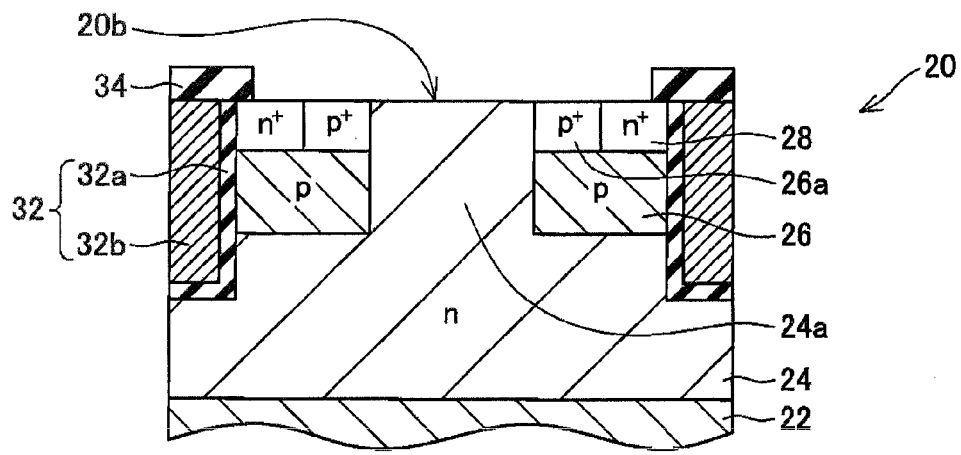
FIG. 4 schematically shows a cross-sectional view of the characteristic part of the semiconductor device during a step of manufacturing the semiconductor device.

Now, as shown in FIG. 3 and FIG. 4, the barrier layer 34 is patterned on the insulating gate portion 32 utilizing the CVD technique and the etching technique. A material for the barrier layer 34 may be a material with hydrofluoric acid resistance. By way of example, the barrier layer 34 is a silicon nitride film.

Figure 5:
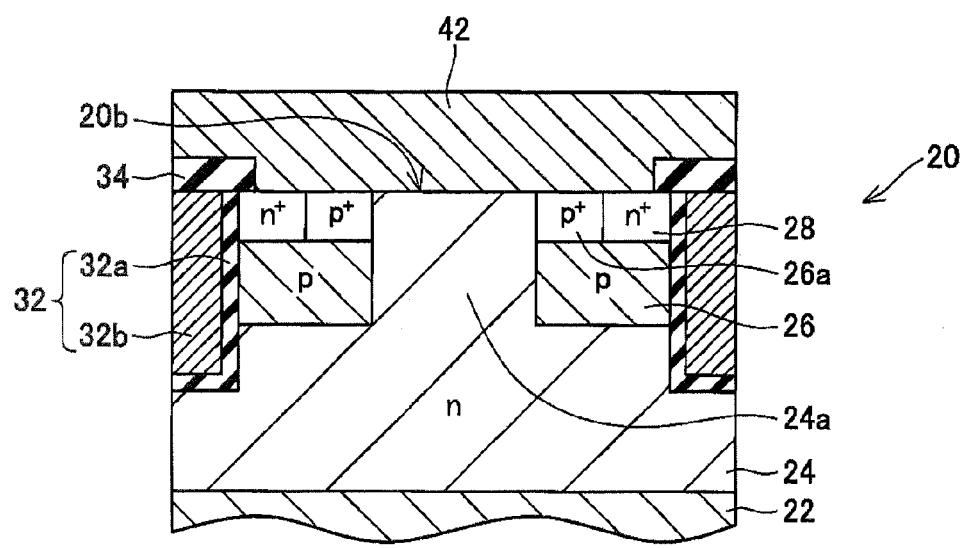
FIG. 5 schematically shows a cross-sectional view of the characteristic part of the semiconductor device during a step of manufacturing the semiconductor device.
Figure 6:
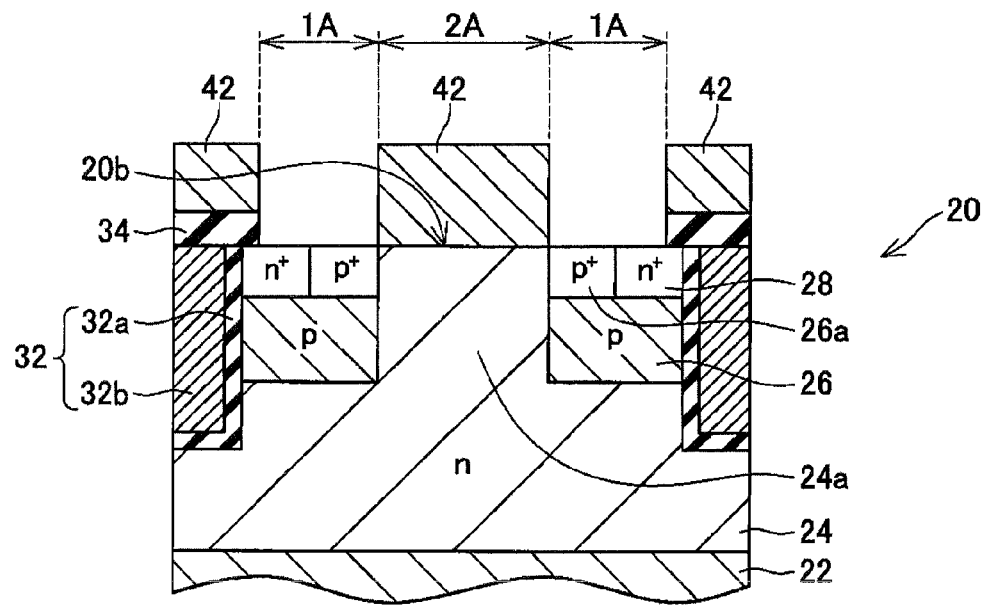
FIG. 6 schematically shows a cross-sectional view of the characteristic part of the semiconductor device during a step of manufacturing the semiconductor device.

Then, as shown in FIG. 5 and FIG. 6, a mask layer 42 is patterned on the barrier layer 34 and the exposure portion 24a of the drift region 24 utilizing the CVD technique and the etching technique. A material for the mask layer 42 has the property of being dissolved in hydrofluoric acid. By way of example, the mask layer 42 is a silicon oxide film.

Figure 7:
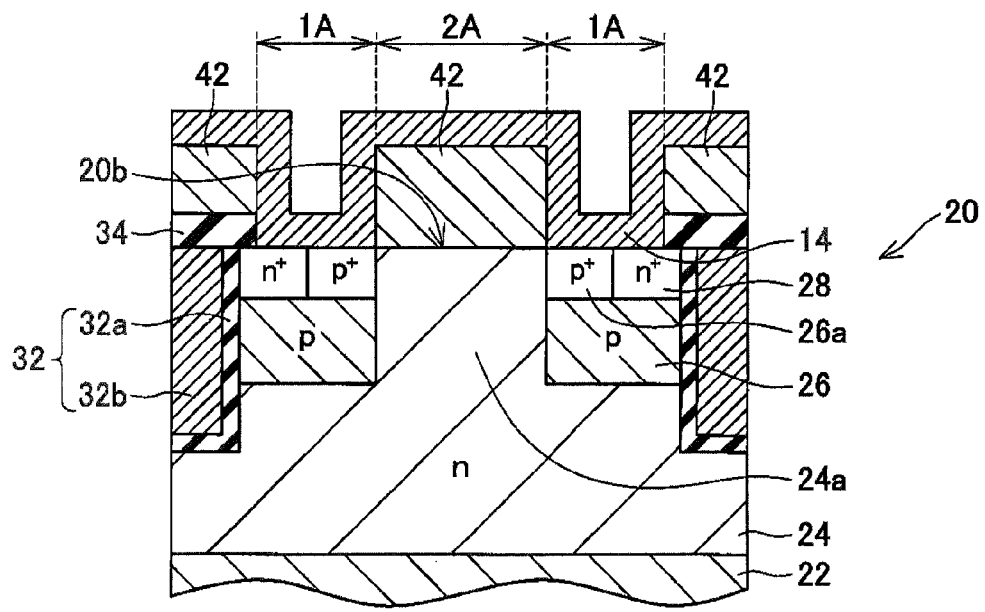
FIG. 7 schematically shows a cross-sectional view of the characteristic part of the semiconductor device during a step of manufacturing the semiconductor device.

Then, as shown in FIG. 7, the ohmic electrode 14 is formed utilizing a PVD technique (sputtering method or vapor deposition method). Subsequently, an anneal process is carried out on the silicon carbide layer 20 at about 1,000° C. for about 10 minutes. This allows an interface portion of the ohmic electrode 14 which is in contact with the silicon carbide layer 20 to be silicided to have ohmic characteristics.

Figure 8:
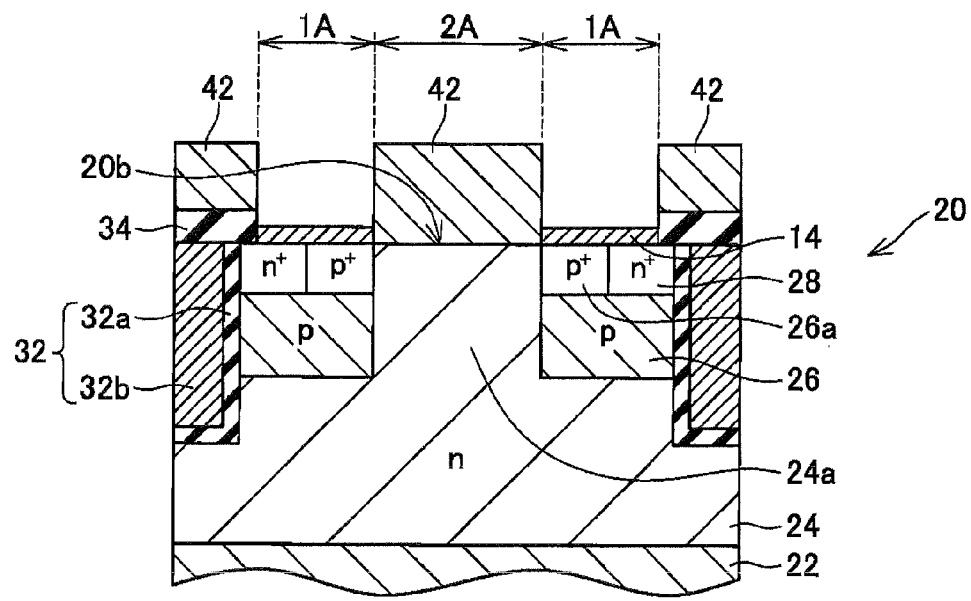
FIG. 8 schematically shows a cross-sectional view of the characteristic part of the semiconductor device during a step of manufacturing the semiconductor device.

Then, as shown in FIG. 8, a portion of the ohmic electrode 14 which is not silicided is selectively removed utilizing a solution having the property of dissolving metal. Thus, the ohmic electrode 14 is patterned in association with the first area 1A on the surface 20b of the silicon carbide layer 20.

Figure 9:
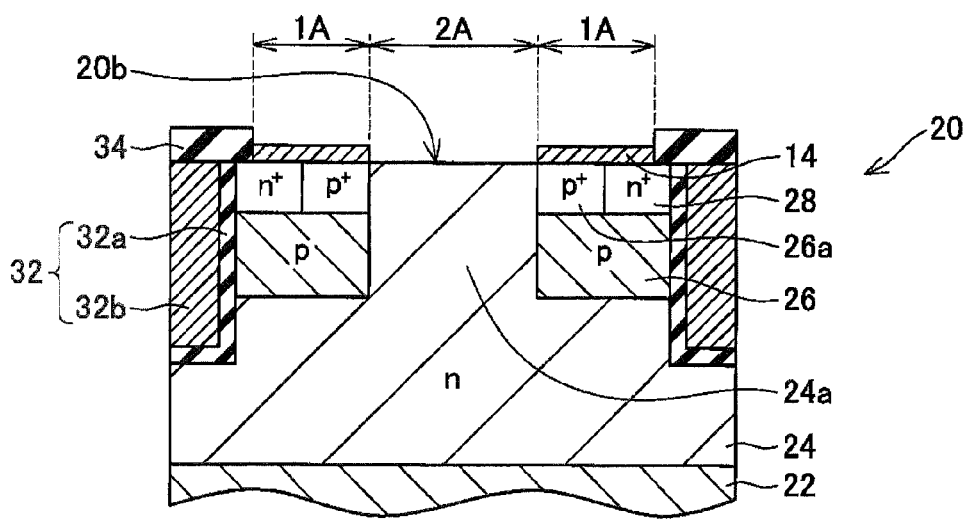
FIG. 9 schematically shows a cross-sectional view of the characteristic part of the semiconductor device during a step of manufacturing the semiconductor device.

Then, as shown in FIG. 9, the mask layer 42 is selectively removed utilizing hydrofluoric acid.

Figure 10:
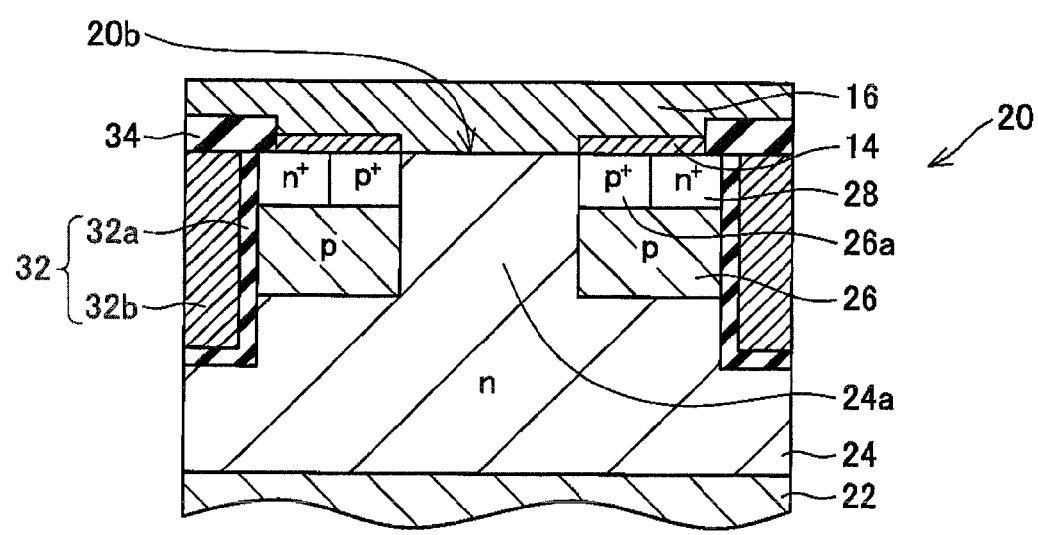
FIG. 10 schematically shows a cross-sectional view of a characteristic part of the semiconductor device during a step of manufacturing the semiconductor device.

Then, as shown in FIG. 10, the Schottky electrode 16 is formed utilizing the PVD technique (sputtering method or vapor deposition technique). The Schottky electrode 16 is formed all over the surface side 20b of the silicon carbide layer 20. At this time, the Schottky electrode 16 is formed by self alignment in contact with the exposure portion 24a of the drift region 24 present between opposite portions of the ohmic electrode 14. Subsequently, the source electrode 18 is formed utilizing the CVD technique on the Schottky electrode 16 to complete the semiconductor device 1 shown in FIG. 1.

Thus, in the method of manufacturing the semiconductor device 1, the ohmic electrode 14 covering the contact portion 26a of the base region 26 and the source region 28 is pre-formed, and a window portion is formed between opposite portions of the ohmic electrode 14. Moreover, the semiconductor device 1 adopts a structure in which the exposure portion 24a of the drift region 24 is exposed in the surface 20b of the silicon carbide layer 20 in association with the window portion. Thus, the Schottky electrode 16 can be produced by self alignment. The semiconductor device 1 can be manufactured by simplified manufacturing steps.

What is claimed is:

1. A semiconductor device comprising:
   a silicon carbide layer;
   an ohmic electrode being in an ohmic contact with a first area on one of main surfaces of the silicon carbide layer; and
   a Schottky electrode being in an ohmic contact with a second area on the one of the main surfaces of the silicon carbide layer,
   wherein the silicon carbide layer comprises:
      a drift region of a first conductivity type, the drift region including an exposure portion exposed in the second area on the one of the main surfaces of the silicon carbide layer;
      a base region of a second conductivity type, the base region disposed above the drift region, exposed in the first area on the one of the main surfaces of the silicon carbide layer, and including portions that are spaced apart by the exposure region in between; and
      a source region of the first conductivity type, the source region surrounded by the base region and exposed in the first area on the one of the main surfaces of the silicon carbide layer.

2. The semiconductor device according to claim 1, further comprising:
   a gate portion facing the base region separating the drift region and the source region.

3. The semiconductor device according to claim 2, wherein the gate portion includes a trench gate electrode filled within a trench penetrating the base region from the one of the main surfaces of the silicon carbide layer.

4. The semiconductor device according to claim 3, further comprising:
   a barrier layer of an insulating material, the barrier layer covering the trench gate electrode,
   wherein the Schottky electrode covers the barrier layer.

* * * * *